(12) United States Patent
Satoh et al.

(10) Patent No.: US 9,276,379 B2
(45) Date of Patent: Mar. 1, 2016

(54) SEMICONDUCTOR LIGHT EMITTING DEVICE AND METHOD FOR MANUFACTURING SAME

(71) Applicant: Panasonic Corporation, Osaka (JP)

(72) Inventors: Tomoya Satoh, Osaka (JP); Takeshi Yokoyama, Hyogo (JP); Shouichi Takasuka, Hyogo (JP); Isao Kidoguchi, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/495,904

(22) Filed: Sep. 25, 2014

(65) Prior Publication Data

US 2015/0043604 A1 Feb. 12, 2015

Related U.S. Application Data

(63) Continuation of application No. PCT/JP2013/004258, filed on Jul. 10, 2013.

(30) Foreign Application Priority Data

Oct. 31, 2012 (JP) .................................. 2012-240181

(51) Int. Cl.
*H01L 27/15* (2006.01)
*H01S 5/22* (2006.01)
(Continued)

(52) U.S. Cl.
CPC . *H01S 5/22* (2013.01); *B82Y 20/00* (2013.01); *H01S 5/3211* (2013.01);
(Continued)

(58) Field of Classification Search
CPC .................. H01L 2924/00; H01L 2224/48091; H01L 2924/00014; H01L 33/32; H01L 33/62; H01L 2224/48247; H01L 2224/48227; H01L 33/38; H01L 33/641; H01S 5/22; H01S 5/3211; H01S 5/34313; H01S 5/3215; B82Y 20/00

USPC ............................................................ 257/79
See application file for complete search history.

(56) References Cited

U.S. PATENT DOCUMENTS 5,321,712 A    6/1994  Itaya et al.
5,436,193 A  *  7/1995  Beernink .............. H01S 5/4043
                                                      148/DIG. 95
(Continued)

FOREIGN PATENT DOCUMENTS

JP    03-156989    7/1991
JP    05-121829    5/1993
(Continued)

OTHER PUBLICATIONS

International Search Report of PCT application No. PCT/JP2013/004258 dated Oct. 15, 2013.

*Primary Examiner* — Jessica Stultz
*Assistant Examiner* — Vu A Vu
(74) *Attorney, Agent, or Firm* — Panasonic Patent Center

(57) ABSTRACT

A semiconductor light emitting device includes a first conductive clad layer that is group III-V semiconductor mixed crystal, an active layer, and a second conductive clad layer. The second conductive clad layer has a laminated structure of at least three layers including a first layer, a second layer, and a third layer disposed in this order closer to the active layer. The second layer and the third layer are included in a striped ridge, and the second layer is positioned at a skirt of the ridge. The surface of the first layer is a flat part at both sides of the ridge. When Al compositions of the first layer, second layer, and third layer are X1, X2, and X3, respectively, the relation X2>X1, X3 is satisfied. When film thicknesses of the first layer, second layer, and third layer are D1, D2, and D3, the relation D2<D3 is satisfied.

23 Claims, 9 Drawing Sheets

(51) Int. Cl.
*H01S 5/32* (2006.01)
*H01S 5/343* (2006.01)
*B82Y 20/00* (2011.01)
*H01L 23/532* (2006.01)
*H01L 21/285* (2006.01)
*H01L 21/316* (2006.01)

(52) U.S. Cl.
CPC ...... *H01S 5/34313* (2013.01); *H01L 21/28575* (2013.01); *H01L 21/31679* (2013.01); *H01L 23/53223* (2013.01); *H01S 5/3215* (2013.01)

(56) References Cited

U.S. PATENT DOCUMENTS

| | | | |
|---|---|---|---|
| 7,133,430 B2 * | 11/2006 | Sato | 372/46.01 |
| 7,558,306 B2 * | 7/2009 | Watanabe | B82Y 20/00 372/45.01 |
| 7,851,810 B2 * | 12/2010 | Chiba et al. | 257/84 |
| 8,263,999 B2 * | 9/2012 | Ohno et al. | 257/103 |
| 2004/0151225 A1 | 8/2004 | Sato | |
| 2004/0204229 A1 | 10/2004 | Walker et al. | |
| 2006/0093003 A1 * | 5/2006 | Moon | B82Y 20/00 372/46.01 |
| 2006/0252519 A1 | 11/2006 | Walker et al. | |
| 2006/0281327 A1 | 12/2006 | Sato | |
| 2006/0284186 A1 | 12/2006 | Uchida et al. | |
| 2007/0091956 A1 | 4/2007 | Sato | |
| 2009/0147814 A1 | 6/2009 | Hosoi et al. | |
| 2009/0201961 A1 | 8/2009 | Sato | |
| 2009/0250719 A1 * | 10/2009 | Fujimori | B82Y 20/00 257/103 |
| 2013/0075772 A1 * | 3/2013 | Koda | H01S 5/2031 257/98 |

FOREIGN PATENT DOCUMENTS

| | | |
|---|---|---|
| JP | 11-026864 | 1/1999 |
| JP | 11-274657 | 10/1999 |
| JP | 3242967 | 12/2001 |
| JP | 2002-050831 | 2/2002 |
| JP | 2004-228340 | 8/2004 |
| WO | 2005/124952 | 12/2005 |
| WO | 2006/077766 | 7/2006 |

* cited by examiner

FIG. 2

| Layer structure name | Al composition X | Film thickness (nm) |
|---|---|---|
| p-type GaAs contact layer | — | 400 |
| p-type AlGaInP intermediate layer | — | 120 |
| Third layer of p-type (Al$_X$Ga$_{1-X}$)$_{0.5}$In$_{0.5}$P clad layer | 0.30 | 600 |
| Second layer of p-type (Al$_X$Ga$_{1-X}$)$_{0.5}$In$_{0.5}$P clad layer | 0.60 | 400 |
| First layer of p-type (Al$_X$Ga$_{1-X}$)$_{0.5}$In$_{0.5}$P clad layer | 0.30 | 200 |
| Al$_X$Ga$_{1-X}$As barrier layer | 0.50 | 30 |
| GaAs well layer | — | 6 |
| Al$_X$Ga$_{1-X}$As barrier layer | 0.50 | 4 |
| GaAs well layer | — | 6 |
| Al$_X$Ga$_{1-X}$As barrier layer | 0.50 | 30 |
| n-type (Al$_X$Ga$_{1-X}$)$_{0.5}$In$_{0.5}$P clad layer | 0.30 | 2500 |
| GaAs substrate | — | — |

SEMICONDUCTOR LIGHT EMITTING DEVICE AND METHOD FOR MANUFACTURING SAME

This is a continuation of International Application No. PCT/JP2013/004258, with an international filing date of Jul. 10, 2013, which claims priority of Japanese Patent Application No. 2012-240181, filed on Oct. 31, 2012, the contents of each of which are hereby incorporated by reference.

BACKGROUND

1. Technical Field

The present disclosure relates to a semiconductor light emitting devices, and more particularly to ridge-type semiconductor lasers and methods for manufacturing same.

2. Description of the Related Art

Semiconductor lasers have been used for diversifying purposes, including optical communications, welding, and medical care in industrial use; and optical disks in commercial use. Many semiconductor lasers adopt a real-guide structure that can easily achieve both improved efficiency of current injection to an active layer and stabilization of lateral mode. There are many ways to obtain the real-guide structure, including buried type and ridge type. With respect to cost reduction and easy manufacture of semiconductor laser, the ridge type is often adopted.

FIG. 6 illustrates the structure of a conventional ridge-type semiconductor laser (Japanese Patent Publication No. 3242967, FIG. 1).

In the structure of the ridge-type semiconductor laser shown in FIG. 6, from p-type GaInP cap layer 108 to p-type AlGaInP clad layer 107 are etched to process a ridge shape. Here, p-type GaInP etching stop layer 106 shown in FIG. 6 is provided between p-type AlGaInP clad layer 105 and p-type AlGaInP clad layer 107. In the conventional method, etching is completed before p-type AlGaInP clad layer 105 is etched, using the condition that an etching rate of p-type GaInP etching stop layer 106 is smaller than an etching rate of p-type AGaInP clad layer 107, in order not to etch p-type GaInP clad layer 105 in an etching process. The etching rate is mainly adjusted by adjusting Al composition in each layer. Normally, if the Al composition is high, the etching rate becomes larger. If the Al composition is low, the etching rate becomes smaller. Therefore, to secure a sufficient difference in etching rates, the conventional ridge-type semiconductor laser uses p-type GaInP without Al as the etching stop layer for securing an etching selectivity with p-type AlGaInP clad layer 107.

SUMMARY

In the case where the above-described semiconductor laser device in FIG. 6, most of the ridge portion is formed of p-type AlGaInP clad layer 107 whose Al composition is set relatively high, in order to secure an etching selectivity of p-type GaInP etching stop layer 106 and p-type AlGaInP clad layer 107. High Al composition in p-type AlGaInP clad layer 107 increases a band gap. This suppresses an overflow of carrier injected in a double heterostructure, and improves a thermal saturation characteristic of optical output. On the other hand, the increased band gap leads to increased operating voltage. This increased operating voltage leads to increased power consumption by the semiconductor laser, which results in unpreferable temperature rise, degraded electrical and optical characteristics, and degraded long-term reliability.

Contrarily, if Al composition in p-type AlGaInP clad layer 107 is reduced, in order to suppress an increase of operating voltage, the etching selectivity with p-type GaInP etching stop layer 106 becomes small. The etching accuracy thus reduces. This means the lateral mode control of semiconductor laser degrades, and an error with respect to designed far field pattern (FFP) increases or manufacturing variations increase, which are not preferable for applications.

Accordingly, the structure disclosed in FIG. 6 has difficulty in reducing the operating voltage.

A primary object of the present disclosure is to achieve a semiconductor light emitting device whose operating voltage is reduced. A secondary object is to improve the ridge formation accuracy by increasing the etching selectivity on forming the ridge.

The semiconductor light emitting device includes a first conductive clad layer, which is group III-V semiconductor mixed crystal, an active layer, and a second conductive clad layer on a substrate. The second conductive clad layer is configured with lamination of at least three layers including a first layer, a second layer, and a third layer disposed in this order closer to the active layer. The second layer and third layer are included in a striped ridge. The second layer is positioned at a skirt of the ridge, and the surface of the first layer is a flat part at both sides of the ridge. Al compositions $X1$, $X2$, and $X3$ in the first layer, second layer, and third layer, respectively, satisfy the relation $X2 > X1, X3$. Film thicknesses $D1$, $D2$, and $D3$ of the first layer, second layer, and third layer, respectively, satisfy the relation $D2 < D3$.

The third layer is a laminated film in which multiple layers having smaller Al composition than that of the second layer are laminated. $D3$ may be the total film thickness of this plurality of laminated layers.

With respect to a slope of side wall of the second layer, a lower part of the second layer may have a gentler slope than an upper part of the second layer.

In addition, $D2$ is preferably not less than 200 nm and not greater than 500 nm.

Both first layer and second layer are made of AlGaInP. $X1$ is preferably not greater than 0.35, and $X2$ preferably not less than 0.55.

The third layer and an upper part of the second layer are processed into stripes by non-selective etching. A lower part of the second layer may be processed into stripes by selective etching.

Non-selective etching may be dry etching, and selective etching may be wet etching.

Next, a method for manufacturing the semiconductor light emitting device includes steps of forming on a substrate a first conductive clad layer, which is group III-V semiconductor mixed crystal; an active layer, and a second conductive clad layer, which has a laminated structure of at least three layers including the first layer, second layer, and third layer disposed in this order closer to the active layer; processing stripes by non-selective etching of the third layer and an upper part of the second layer; and processing stripes by selective etching of a lower part of the second layer. Al compositions $X1$, $X2$, and $X3$ of the first layer, second layer, and third layer satisfy the relation $X2 > X1, X3$. Film thicknesses $D1$, $D2$, and $D3$ of the first layer, second layer, and third layer satisfy the relation $D2 < D3$.

The semiconductor light emitting device with reduced operating voltage can be achieved.

BRIEF DESCRIPTION OF DRAWINGS

FIG. 2 shows Al composition and film thickness of each layer of the semiconductor laser in accordance with the exemplary embodiment.

DETAILED DESCRIPTION OF THE PREFERRED EMBODIMENTS

A semiconductor light emitting device in the exemplary embodiment is described with reference to FIGS. 1 to 5. The semiconductor light emitting device in the exemplary embodiment is a ridge-type semiconductor laser. The present disclosure is not limited to a structure and a manufacturing method in the exemplary embodiment. They can be modified as appropriate.

Figure 1:
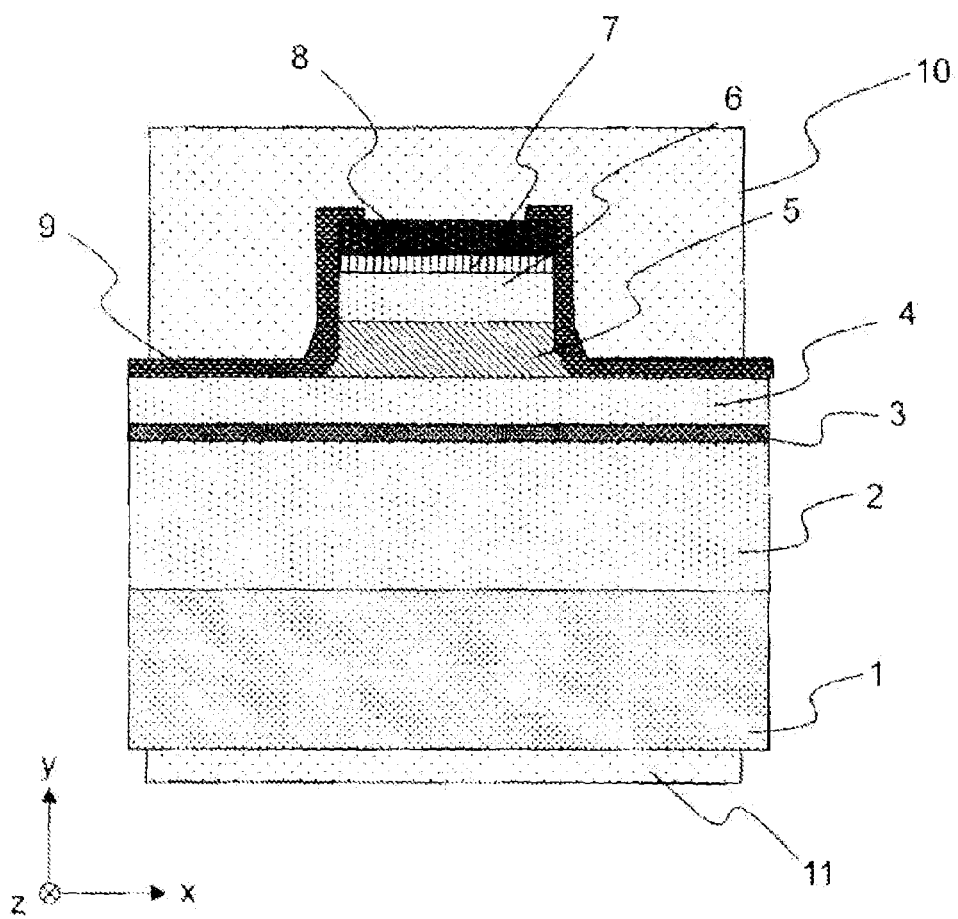
FIG. 1 shows a cross-section structure of a semiconductor laser in accordance with an exemplary embodiment.

FIG. 1 is a sectional view of the semiconductor laser in the exemplary embodiment. The semiconductor laser in the exemplary embodiment includes, when X refers to Al composition, n-type $(Al_xGa_{1-x})_{0.5}In_{0.5}P$ clad layer 2 that is group III-V semiconductor mixed crystal, active layer 3 formed of a GaAs well layer and an $Al_xGa_{1-x}As$ barrier layer, first layer 4 of a p-type $(Al_xGa_{1-x})_{0.5}In_{0.5}P$ clad layer, second layer 5 of the p-type $(Al_xGa_{1-x})_{0.5}In_{0.5}P$ clad layer, third layer 6 of the p-type $(Al_xGa_{1-x})_{0.5}In_{0.5}P$ clad layer, p-type AlGaInP intermediate layer 7, and p-type GaAs contact layer 8. From second layer 5 of p-type $(Al_xGa_{1-x})_{0.5}In_{0.5}P$ clad layer to p-type GaAs contact layer 8 are processed into stripes to form a ridge. Second layer 5 of p-type $(Al_xGa_{1-x})_{0.5}In_{0.5}P$ clad layer is positioned at a skirt of the ridge. The surface of first layer 4 of the p-type $(Al_xGa_{1-x})_{0.5}In_{0.5}P$ clad layer is a flat part at both sides of the ridge. The ridge and the flat part at its both sides are coated with dielectric film 9 for current constriction and optical confinement. Dielectric film 9 has an opening at the ridge top, and p-type GaAs contact layer 8 is exposed from this opening. Still more, p-side electrode 10 is deposited on the surface of dielectric film 9 and the surface of p-type GaAs contact layer 8 exposed from the opening of dielectric film 9, and n-side electrode 11 is deposited on a rear face of GaAs substrate 1.

FIG. 2 shows Al composition and film thickness of each layer of the semiconductor laser in the exemplary embodiment shown in FIG. 1. The composition and film thickness of each layer shown in this table are simply an example. As long as the relation described below is satisfied, they can be changed as required. The p-type clad layer has a laminated structure configured with at least three layers including the first layer, second layer, and third layer in the order close to the active layer. When the Al compositions in the first layer, second layer, and third layer are X1, X2, and X3; they satisfy the relation X2>X1, X3. In this exemplary embodiment, Al composition (X2) in the second layer is high, which is 0.60; and Al composition (X1) in the first layer and Al composition (X3) in the third layer are smaller than X2. In addition, when film thicknesses of the first layer, second layer, and third layer are D1, D2, and D3; they satisfy the relation D2<D3.

Since the film thickness of each layer satisfies the relation D2<D3, based on the relation described above, in the semiconductor laser in the exemplary embodiment, the ridge is configured with a layer with relatively low Al composition. Therefore, a semiconductor light emitting device with reduced operating voltage can be achieved. In addition, since the second layer of the second conductive clad layer is positioned at a skirt of the ridge and Al composition of each layer satisfies the relation X2>X1, X3; etching selectivity on forming the ridge is increased, and thus the ridge formation accuracy can be improved.

The first layer, second layer, and third layer may contact each other, or there may be another layer between them without making contact.

Still more, each of the first layer, second layer, and third layer may not be a single layer and be formed of multiple layers with different compositions. For example, the third layer may be a laminated film of multiple layers with Al composition lower than that of the second layer. As long as its total film thickness is thicker than the film thickness of the second layer, the above relations (X2>X3, D2<D3) are satisfied.

The description "positioned at the skirt of the ridge" does not limit to the lowest part of the ridge. A position near the lowest part of the ridge is acceptable. For example, an extremely-thin low-Al composition layer may exist between the lowest part of the ridge and the second layer.

The first layer does not have to contact with the active layer. Another layer, such as a guide layer, may be inserted between them.

With respect to the Al compositions and film thicknesses shown in FIG. 2 of the semiconductor layer in the exemplary embodiment, the relation of etching rate te1 of the first layer of the p-type $(Al_xGa_{1-x})_{0.5}In_{0.5}P$ clad layer and etching rate te2 of the second layer of the p-type $(Al_xGa_{1-x})_{0.5}In_{0.5}P$ clad layer id set to satisfy te1<te2, so as to improve the accuracy of ridge processing. This is also set to prevent degradation of slope efficiency, which is an important characteristic of the semiconductor laser, and satisfy a required FFP characteristic.

In the following description, unless particularly indicated, Al composition X is omitted and $(Al_xGa_{1-x})_{0.5}In_{0.5}P$ is simply indicated as AlGaInP, and $Al_xGa_{1-x}As$ is simply indicated as AlGaAs.

Figure 3A:
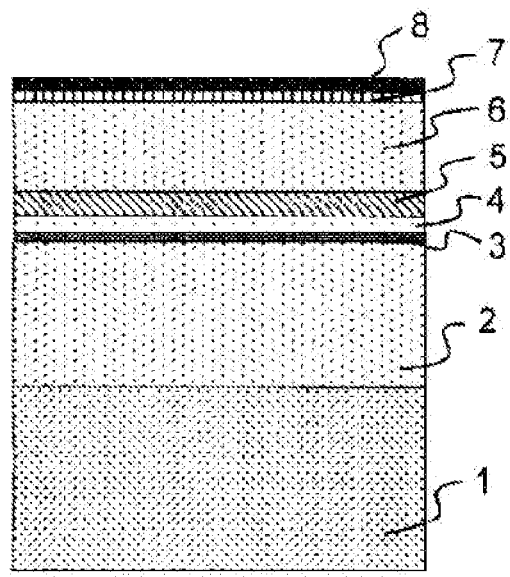
FIG. 3A is a method for manufacturing the semiconductor laser in accordance with the exemplary embodiment.
Figure 3B:
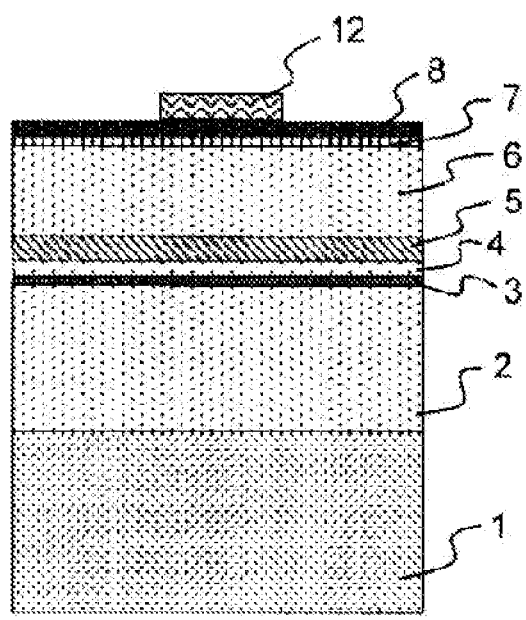
FIG. 3B is the method for manufacturing the semiconductor laser in accordance with the exemplary embodiment.
Figure 3C:
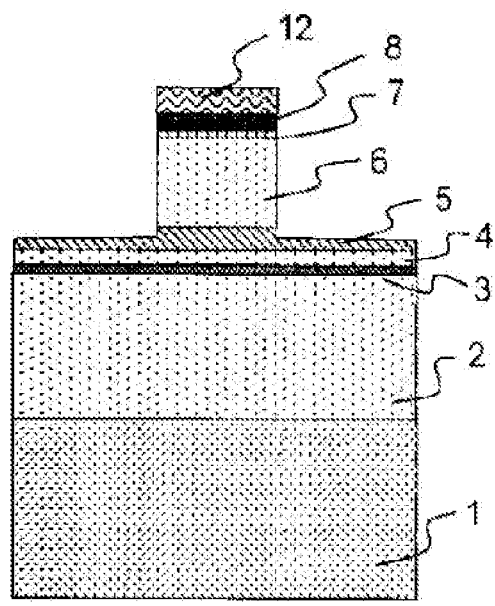
FIG. 3C is the method for manufacturing the semiconductor laser in accordance with the exemplary embodiment.

Next, the method for manufacturing the semiconductor laser in the exemplary embodiment is described with reference to FIGS. 3A to 3H. First, as shown in FIG. 3A, crystal is grown, typically using the MOCVD method, on GaAs substrate 1 for n-type AlGaInP clad layer 2 to p-type GaAs contact layer 8. Their Al compositions and film thicknesses are set according to FIG. 2. Then, as shown in FIG. 3B, mask 12, such as of SiO2, is formed typically using lithography for processing p-type GaAs contact layer 8 to second layer 5 of the p-type AlGaInP clad layer into a stripe to form the ridge. Next, as shown in FIG. 3C, the ridge is formed by non-selective etching, such as dry etching. Here, dry etching is applied to the middle of second layer 5 of the p-type AlGaInP clad layer. A part processed into a stripe by non-selective etching is an upper part of second layer 5 of the p-type AlGaInP clad layer. Aforementioned dry etching technology preferably adopted in the exemplary embodiment is anisotropic plasma etching. Examples of dry etching are methods using induction coupled plasma (ICP) and electron cyclotron resonance (ECR) plasma. As etching gas, mixed gas of $SiCl_4$ and Ar is used. However, instead of $SiCl_4$, chlorine gas or boron trichloride gas may be used. In the exemplary embodiment, the ICP method is used for dry etching, and mixed gas of $SiCl_4$ and Ar is used as etching gas. As etching conditions, a volume content of $SiCl_4$ in the mixed gas is 5 to 12%, temperature of bottom electrode on which the semiconductor substrate is placed is 150 to 200° C., pressure inside chamber is 0.1 to 1 Pa, bias power of the bottom electrode is 50 to 150 W, and ICP power is 200 to 300 W. However, conditions are not limited to these. They may be selected as appropriate.

Figure 3D:
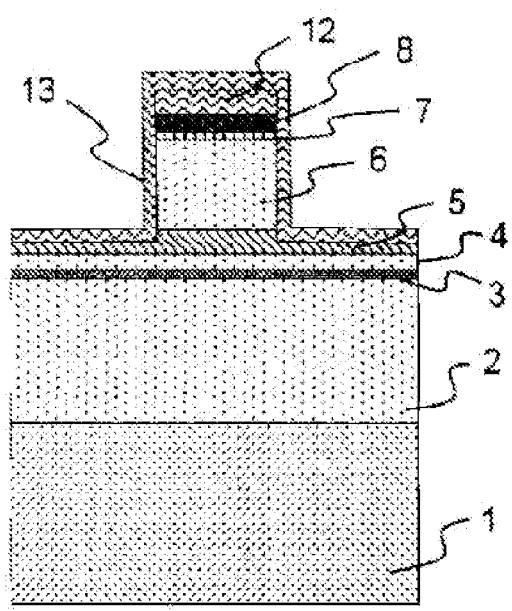
FIG. 3D is the method for manufacturing the semiconductor laser in accordance with the exemplary embodiment.

Next, as shown in FIG. 3D, side wall protective film 13, such as $SiO_2$, is formed on the side wall of the ridge, in order to protect the ridge after dry etching. The SiO2 film is used as the side wall protective film in the exemplary embodiment, but this is not limited. Any materials having the next properties may be used for the side wall protective film of the ridge: (1) Secures etching solution resistance against wet etching solution used in a process described later, (2) Does not generate an intermediate product with the AlGaInP semiconductor layer, and (3) Has high film controllability at film formation. More specifically, above materials include, in addition to $SiO_2$ film, metal films and organic films having properties of dielectric films such as SiN and $Al_2O_3$, semiconductor layers such as GaAs and AlGaAs. Means for forming these protective films include CVD (e.g., plasma CVD, atmospheric CVD, MOCVD, etc.) and PVD (sputter, deposition, etc.). In the exemplary embodiment, plasma CVD is particularly preferable because this method facilitates formation of film with highly uniform film thickness. CVD is abbreviation for chemical vapor deposition, and PVD is abbreviation for physical vapor deposition. The side wall protective film used in the exemplary embodiment of the present disclosure is a single layer of $SiO_2$ film. However, this is not limited. The side wall protective film may be configured with multiple layers.

Figure 3E:
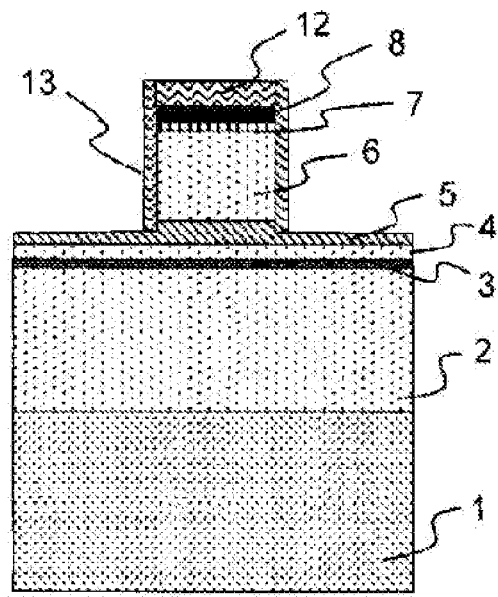
FIG. 3E is the method for manufacturing the semiconductor laser in accordance with the exemplary embodiment.

Then, as shown in FIG. 3E, the SiO2 protective film is removed by dry etching except for that on the ridge side walls and ridge top to achieve a structure that only the ridge side walls and ridge top are covered with the protective film. Drying etching methods adopted in this process include reactive ion etching (RIE), ICP, and ECR. As etching gas, CF gas, such as mixed gas of $CF_4$ and $CHF_3$, is used. The exemplary embodiment adopts RIE, and uses mixed gas of $CF_4$, $CHF_4$, and $O_2$ as etching gas. With respect to dry-etching conditions, volume contents of $CF_4$ and $CHF_3$ in the mixed gas are 1 to 10% and 30 to 50%, respectively; pressure is 40 to 60 Pa, and stage temperature is 10 to 20° C. However, the conditions are not limited. They can be changed as required.

Figure 3F:
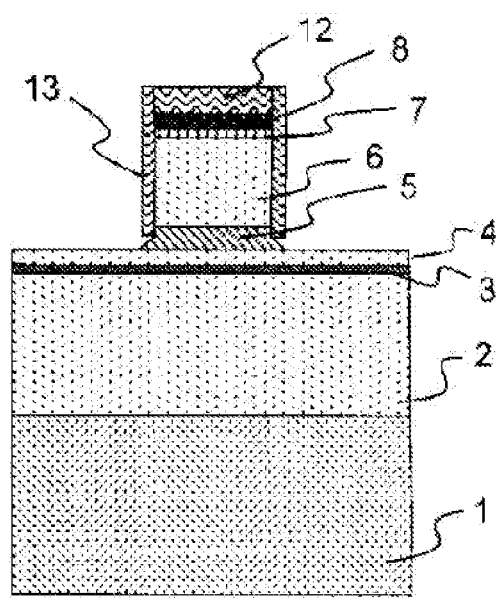
FIG. 3F is the method for manufacturing the semiconductor laser in accordance with the exemplary embodiment.

Next, as shown in FIG. 3F, second layer 5 of the p-type AlGaInP clad layer is completely removed by selective etching, such as wet etching. A striped part processed by this selective etching becomes a lower part of second layer 5 of the p-type AlGaInP clad layer. As wet-etching solution, hydrochloride solution that is a mixed solution of acidum tartaricum, hydrochloric acid, and water (a volume content of acidum tartaricum in the solution is 30 to 50% and a volume content of hydrochloric acid is 15 to 35%) is used for etching. Here, since the relation of etching rate te1 of first layer 4 of the p-type AlGaInP clad layer and etching rate te2 of second layer 5 of the p-type AlGaInP clad layer is te1<te2, first layer 4 of the p-type AlGaInP clad layer will practically be not etched after completing etching of second layer 5 of the p-type AlGaInP clad layer because first layer 4 has resistance to hydrochloride solution. Accordingly, wet etching for forming stripes can be completed at the time first layer 4 of the p-type AlGaInP clad layer is exposed. Completion of wet etching can be determined by visually confirming interference stripes in an etching area on the surface of semiconductor substrate. When first layer 4 of the p-type AlGaInP clad layer is exposed, the etching speed in the vertical direction relative to the substrate surface extremely drops, and change of interference stripes in the etching area stops because uniformity of film thickness on the substrate surface is improved. Accordingly, stoppage of etching in the vertical direction relative to the substrate surface can be confirmed. In the exemplary embodiment, a hydrochloride solution is used as a solution for wet etching second layer 5 of the p-type AlGaInP clad layer. However, the solution is not limited. Any solution that shows high selectivity for the SiO2 side wall protective film and first layer 4 of the p-type AlGaInP clad layer is applicable. For example, a sulfuric acid solution may be used.

If wet etching does not completely stop on the surface of first layer 4 of the p-type AlGaInP clad layer, neighboring surface of first layer 4 of the p-type AlGaInP clad layer will also be processed into stripes, and becomes a part of the ridge. Even in this case, second layer 5 of the p-type AlGaInP clad layer still remains at the skirt of the ridge.

Figure 3G:
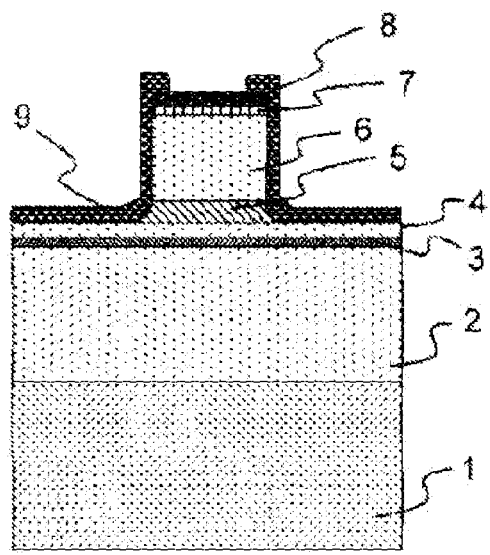
FIG. 3G is the method for manufacturing the semiconductor laser in accordance with the exemplary embodiment.
Figure 3H:
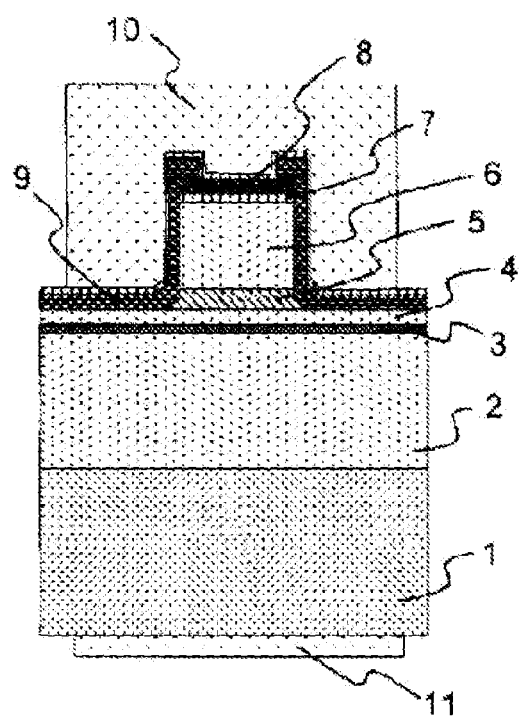
FIG. 3H is the method for manufacturing the semiconductor laser in accordance with the exemplary embodiment.

Then, as shown in FIG. 3G, mask 12 and side wall protective film 13 are removed, using a hydrofluoric acid solution, and then the side walls of the ridge and the flat parts at its both sides are coated with a current blocking layer formed of dielectric film 9. In the exemplary embodiment, wet etching is used for removing mask 12 and side wall protective film 13. However, a removal method is not limited to wet etching. An appropriate chemical dry etching (CDE) is preferably selected depending on materials configuring mask 12 and side wall protective film 13. Here, to reduce a light radiation loss from the ridge, it is preferable to use a dielectric film that has smaller refractive index and smaller absorbing coefficient than a semiconductor material with respect to laser emission wavelengths, such as SiN, $SiO_2$, $Ta_2O_5$, and $Al_2O_3$. In addition, an opening is created in dielectric film 9. Then, as shown in FIG. 3H, p-side electrode 10 and n-side electrode 11 are formed. In the manufacturing method in the exemplary embodiment, as described above, non-selective etching and selective etching are used for forming the ridge. In this case, the side wall at the upper part of second layer 5 of the p-type AlGaInP clad layer processed by non-selective etching is almost perpendicular to the substrate surface. On the other hand, the side wall at the lower part of second layer 5 of the p-type AlGaInP clad layer processed by selective etching has a gentler slope than the side wall at the upper part. The ridge side wall processed by selective etching has a gentle slope because an etching rate of selective etching, such as wet etching, differs by crystal plane orientation. In the exemplary embodiment, (100) plane, which is the crystal plane orientation of the GaAs substrate is the main face, and (111) plane appears on the side wall at the lower part of the second layer.

Figure 4:
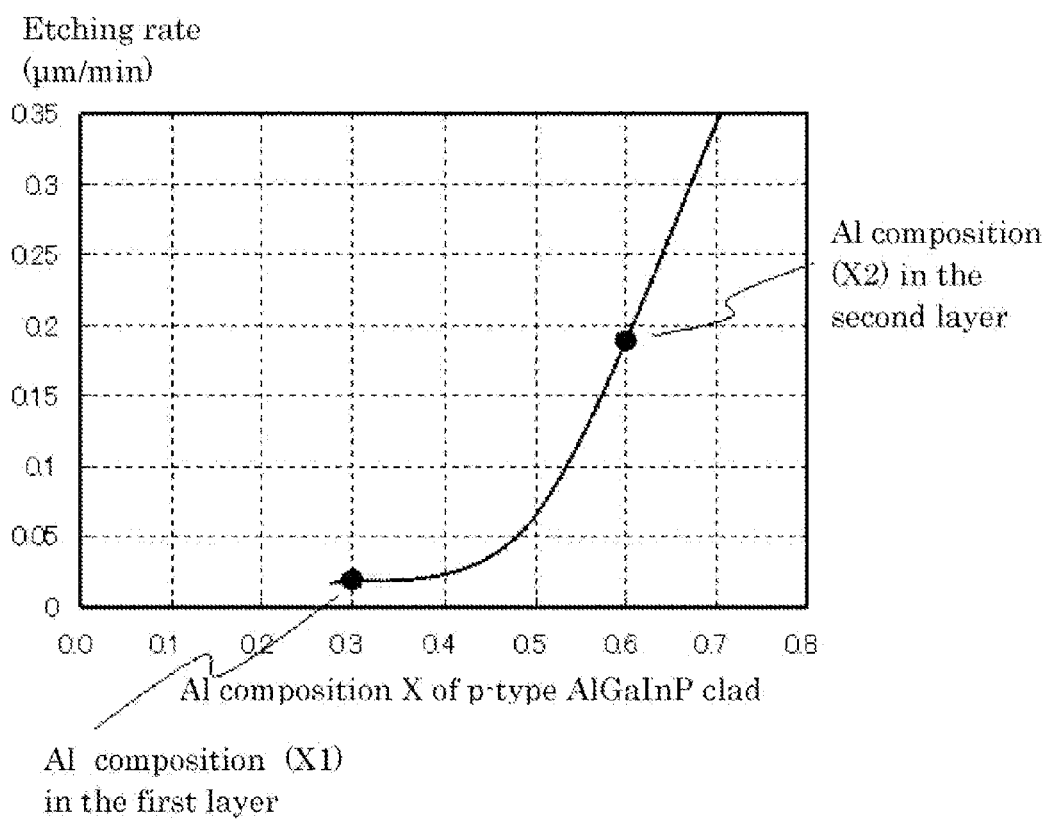
FIG. 4 shows a relation of Al composition and an etching rate of a p-type AlGaInP clad layer of the semiconductor laser in accordance with the exemplary embodiment.

FIG. 4 shows a relation of Al composition X and etching rate of the p-type AlGaInP clad layer of the semiconductor laser in the exemplary embodiment. As shown in FIG. 4, the etching rate is almost fixed when Al composition X is 0.35 or less. The etching rate sharply increases when Al composition X exceeds 0.35. Etching rates when Al composition X is 0.55 or above show a tendency of increase at almost constant rate. In the method for manufacturing the semiconductor laser in the exemplary embodiment, selectivity te2/te1 of etching rate te1 of first layer 4 of the p-type AlGaInP clad layer and etching rate te2 of second layer 5 of the p-type Al GaInP clad layer is preferably set high. More specifically, as shown in FIG. 4, Al composition (X1) of the first layer of the p-type AlGaInP clad layer is set to any value not greater than 0.35 where etching rate is almost fixed against Al composition X. Al composition (X2) of the second layer of the p-type AlGaInP clad layer is set to any value not less than 0.55 where the etching rate increases at a constant rate against Al composition X. For example, Al composition (X2) of the second layer of the p-type AlGaInP clad layer is set to 0.55, and Al composition (X1) of the first layer of the p-type AlGaInP clad layer is set to 0.35, in order to achieve the selectivity of 6 or more. In this case, a ratio of Al composition X2 to X1 becomes 1.6 times or more. If selectivity is 6 or more, processing of stripes can be completed after completely etching second layer 5 of the p-type AlGaInP clad layer, but not etching first layer 4 of the p-type AlGaInP clad layer. If the selectivity is small, influence of film thickness distribution of epilayer and dry etching distribution on the wafer face at forming the ridge affect the quality of ridge shape. In other words, in practical production, film thickness distribution of semiconductor layer and etching depth distribution within the wafer face in dry etching result in varying an etching amount of second layer 5 of the p-type AlGaInP clad layer within the wafer face at wet etching. If wet-etching time is set long to completely remove second layer 5 of the p-type AlGaInP clad layer when the selectivity is small, the surface of first layer 4 of the p-type AlGaInP clad layer is exposed to the etching solution for a long time after second layer 5 of the p-type AlGaInP clad layer is etched. As a result, etching may make progress into first layer 4 of the p-type AlGaInP clad layer. The film thickness of first layer 4 of the p-type AlGaInP clad layer at both sides of the ridge thus becomes thin, resulting in stronger optical confinement in the horizontal direction of the semiconductor laser. If the optical confinement in the horizontal direction becomes strong, FFP characteristic may become far different from a designed value. In addition, if the optical confinement in the horizontal direction becomes strong, a single-mode characteristic of the semiconductor laser weakens. This likely causes kink, which is a phenomenon of increasing optical output and also degrading linear formation of the current-optical output characteristic.

If the etching time of second layer 5 of the p-type AlGaInP clad layer is set short to prevent etching of first layer 4 of the p-type AlGaInP clad layer, etching may complete before completely etching second layer 5 of the p-type AlGaInP clad layer. If second layer 5 of the p-type AlGaInP clad layer is not completely etched, the film thickness of the p-type AlGaInP clad layer at both sides of the ridge becomes a sum of the film thickness of first layer 4 of the p-type AlGaInP clad layer and the film thickness of remaining unetched second layer 5 of the p-type AlGaInP clad layer, resulting in a thick film. In this case, optical confinement in the horizontal direction of the semiconductor laser becomes weak, and horizontal FFP becomes too narrow. Too weak optical confinement in the horizontal direction gives detrimental effect on characteristics, such as increased threshold current of the semiconductor laser. In the exemplary embodiment, selectivity of 10 or more is secured by setting X2 to 0.6 and X1 to 0.3, which means a ratio of X2 to X1 is double or more. Accordingly, in the exemplary embodiment, variation allowance is secured against the quality of ridge shape by securing the selectivity of 10 or above. As described above, the selectivity is preferably 6 or above, and more preferably 10 or above.

Figure 6:
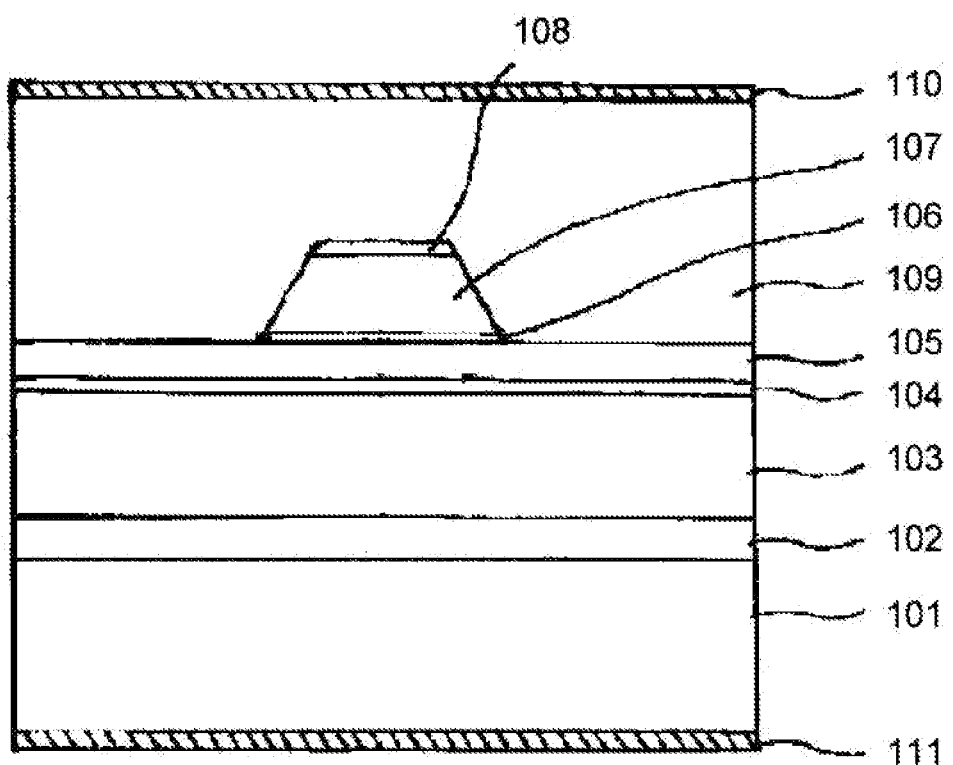
FIG. 6 shows a cross-section structure of a conventional semiconductor laser.

In the conventional semiconductor laser shown in FIG. 6, the etching rate of the ridge needs to be increased, in order to increase the etching selectivity on forming the ridge. In other words, Al composition in the p-type AlGaInP clad layer that forms the ridge needs to be increased. This increases a band gap of the ridge and also increases resistance of the ridge. Since a series resistance component of the ridge-type semiconductor laser is almost determined by resistance of the p-type clad layer of the ridge, series resistance of the semiconductor layer increases if Al composition in the p-type AlGaInP clad layer is increased too much. This results in increasing the operating voltage. Increased operating voltage of the semiconductor laser invites increased power consumption, which is not preferable. Accordingly, it is difficult to achieve both improved etching selectivity on forming the ridge (i.e., improvement of the ridge processing accuracy) and reduced operating voltage of the semiconductor laser in the conventional semiconductor laser.

On the other hand, in the semiconductor laser in the exemplary embodiment, Al composition (X1) in the first layer and Al composition (X3) in the third layer of the p-type AlGaInP clad layer are smaller than Al composition (X2) in the second layer. In addition, film thickness (D2) of the second layer of the p-type AlGaInP clad layer is smaller than film thickness (D3) of the third layer. In this structure, a proportion of the third layer with relatively low Al composition is higher than the second layer with high Al composition in the ridge. Accordingly, a semiconductor light-etching device whose operating voltage is reduced can be achieved. Still more, a difference in Al compositions of the second layer and the first layer enables to form the ridge more accurately. Still more, the third layer with low Al composition can be efficiently etched by using non-selective etching for processing the third layer and also up to the upper part of the second layer into stripes, and using selective etching for processing the lower part of the second layer into stripes. Etching can also be completed accurately near the surface of the first layer.

Basically, the value of X3 is preferably equivalent to the value of X1. If X3 is too high, a band gap of third layer 6 of the p-type AlGaInP clad layer increases. This leads to an increase of the operating voltage of the semiconductor laser. If X3 is set too low, optical distribution in the vertical direction of the semiconductor laser comes close to p-type GaAs contact layer 8. This may lead to degradation of the slope efficiency of the semiconductor laser due to increased optical absorption loss.

Still more, in the semiconductor laser in the exemplary embodiment, film thickness D2 of second layer 5 of the p-type AlGaInP clad layer is set to 400 nm. D2 is preferably not less than 200 nm and not greater than 500 nm. If D2 is less than 200 nm, the etching time needs to be precisely adjusted in order to stop non-selective etching in the middle of the second layer. If D2 is set greater than 500 nm, a proportion of the layer with high Al composition in the ridge increases, and thus the operating voltage of the semiconductor laser may increase.

Next, characteristics of the semiconductor laser in the exemplary embodiment are described. Each layer of the semiconductor laser in the exemplary embodiment has Al composition and film thickness shown in FIG. 2. The ridge width is 3.0 μm and resonator length is 350 μm.

Figure 5:
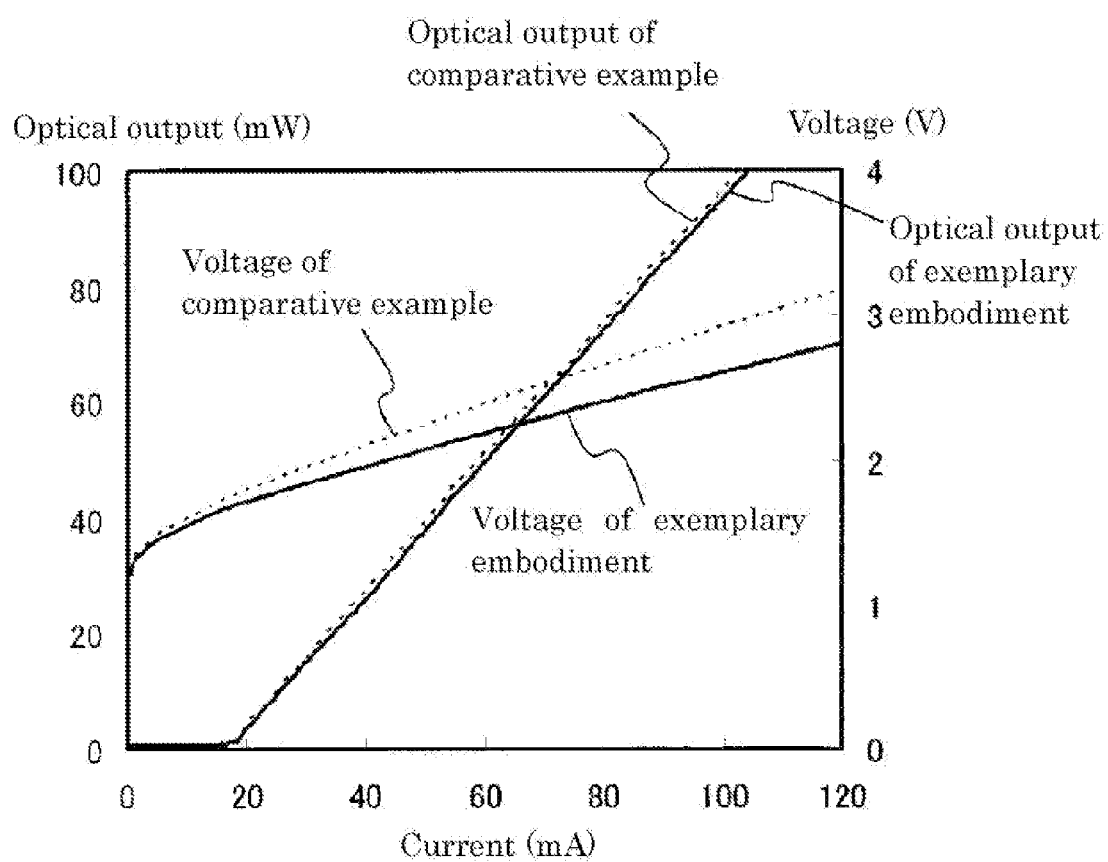
FIG. 5 shows a current-optical output characteristic and a current-voltage characteristic of the semiconductor laser in accordance with the exemplary embodiment.

FIG. 5 shows the current-optical output characteristic and current-voltage characteristic at 80° C. of a comparative example and the exemplary embodiment. In FIG. 5, broken lines indicate the current-optical output characteristic and the current-voltage characteristic of a comparative example. Solid lines indicate the current-optical output characteristic and the current-voltage characteristic in the exemplary embodiment. A semiconductor laser of the comparative example basically has the structure of the conventional semiconductor laser shown in FIG. 6. Al compositions in p-type AlGaInP clad layer 105 and p-type AlGaInP clad layer 107 are set to 0.65, and Al composition in p-type GaInP etching stop layer 106 is set to 0.3. As shown in FIG. 5, the current-optical output characteristic of the semiconductor laser in the exemplary embodiment is almost equivalent to that of the comparative example. On the other hand, improvement in the current-voltage characteristic, compared to that of the comparative example, is confirmed. The slope efficiency is 1.18 W/A in the comparative example, and 1.15 W/A in the exemplary embodiment. The operating voltage when optical output is 50 mW is 2.37 V in the comparative example, whereas 2.19 V in the exemplary embodiment. Compared to the comparative example, reduction by 9.2% is achieved. The wall plug efficiency (WPE) when optical output is 50 mW is 35.8% in the comparative example, and 37.9% in the exemplary embodiment, which is about 2.1% improvement. With respect to the FFP characteristic at 50 mW, horizontal FFP is 9.0° and vertical FFP is 18.9° in the comparative example. On the other hand, in the exemplary embodiment, horizontal FFP is 8.5° and vertical FFP is 19.5°, which are about the same values as those in the comparative example. Accordingly, the semiconductor laser in the exemplary embodiment achieves the level equivalent to the comparative example with respect to the current-optical output characteristic and FFP characteristic. Furthermore, the current-voltage characteristic and the operating voltage at optical output are drastically reduced in the exemplary embodiment.

As described above, it is confirmed that the semiconductor laser in the exemplary embodiment achieves a semiconductor light emitting device with reduced operating voltage. Furthermore, the FFP characteristic remains equivalent to the conventional semiconductor laser by improving the ridge formation accuracy. In other words, the semiconductor laser in the exemplary embodiment achieves reduced operating voltage without degrading the ridge formation accuracy.

The present disclosure reduces power consumption by reducing the operating voltage of the semiconductor laser, and thus enables downsizing and low power consumption of equipment using this semiconductor laser.

What is claimed is:

1. A III-V semiconductor light emitting device comprising a first conductive clad layer, an active layer, and a second conductive clad layer laminated on a substrate in this order closer to the substrate, wherein
    the second conductive clad layer is an AlGaInP-based semiconductor mixed crystal and has a laminated structure of at least three layers, including a first layer, a second layer, and a third layer disposed in this order closer to the active layer,
    the second layer and the third layer are included in a striped ridge, and the second layer is positioned at a skirt of the ridge,
    the first layer has a flat surface under both sides of the striped ridge and parallel to the active layer,
    Al compositions X1, X2, and X3 of the first layer, the second layer, and the third layer, respectively, satisfy a relation:
    X2>X1 and X2>X3, and
    film thicknesses D1, D2, and D3 of the first layer, the second layer, and the third layer, respectively, satisfy a relation:
    D2<D3.

2. The III-V semiconductor light emitting device of claim 1,
    wherein
    a side wall of the third layer is substantially perpendicular to a plane of the substrate.

3. The III-V semiconductor light emitting device of claim 1,
    wherein
    a slope of a side wall of the second layer is gentler at a lower part of the second layer than at an upper part of the second layer.

4. The III-V semiconductor light emitting device of claim 3,
    wherein
    the slope of the side wall of the second layer has a shape substantially perpendicular to a surface of the substrate at its upper part, and a shape flaring downward at its lower part.

5. The III-V semiconductor light emitting device of claim 1,
    wherein
    the third layer is a laminated film of a plurality of laminated layers having smaller Al composition than the second layer, and the D3 is a total film thickness of the plurality of laminated layers.

6. The III-V semiconductor light emitting device of claim 1,
    wherein
    the D2 is not less than 200 nm and not greater than 500 nm.

7. The III-V semiconductor light emitting device of claim 1,
    wherein
    the first layer, the second layer, and the third layer are formed of AlGaInP.

8. The III-V semiconductor light emitting device of claim 1,
    wherein
    the third layer to an upper part of the second layer are processed into a stripe shape by non-selective etching, and a lower part of the second layer is processed into a stripe shape by selective etching.

9. The III-V semiconductor light emitting device of claim 8,
    wherein
    the non-selective etching is dry etching, and the selective etching is wet etching.

10. A method for manufacturing a III-V semiconductor light emitting device, the method comprising:
    forming on a substrate a first conductive clad layer, an active layer, and a second conductive clad layer, the second conductive clad layer is an AlGaInP-based semiconductor mixed crystal and has a laminated structure of at least three layers including a first layer, a second layer, and a third layer disposed in an order closer to the active layer;
    processing the third layer to an upper part of the second layer into a stripe shape by non-selective etching; and
    processing a lower part of the second layer into a stripe shape by selective etching,
    wherein
    Al compositions X1, X2, and X3 of the first layer, the second layer, and the third layer, respectively, satisfy a relation:
    X2>X1 and X2>X3, and film thicknesses D1, D2, and D3 of the first layer, the second layer, and the third layer, respectively, satisfy a relation:

D2<D3.

11. The method for manufacturing the III-V semiconductor light emitting device of claim 10,
wherein
a slope of a side wall of the third layer formed by the step of processing the stripe shape is substantially perpendicular to a plane of the substrate.

12. The method for manufacturing the III-V semiconductor light emitting device of claim 10,
wherein
a slope of a side wall of the second layer formed by the step of processing into the stripe shape is gentler at the lower part than at the upper part.

13. The III-V semiconductor light emitting device of claim 12,
wherein
the slope of the side wall of the second layer has a shape substantially perpendicular to a surface of the substrate at its upper part, and a tapered shape spreading downward at its lower part.

14. The method for manufacturing the III-V semiconductor light emitting device of claim 10,
wherein
the D2 is not less than 200 nm and not greater than 500 nm.

15. The method for manufacturing the III-V light emitting device of claim 10,
wherein
the first layer and the second layer are both formed of AlGaInP, the X1 is not greater than 0.35, and the X2 is not less than 0.55.

16. The method for manufacturing the III-V semiconductor light emitting device of claim 10,
wherein
the non-selective etching is dry etching, and the selective etching is wet etching.

17. The III-V semiconductor light emitting device of claim 1, wherein the X1 is not greater than or equal to 0.35, and the X2 is not less than 0.55.

18. The III-V semiconductor light emitting device of claim 1, wherein a sidewall of the striped ridge is covered by a current blocking layer, and the current blocking layer is in direct contact with the flat surface of the first layer.

19. The III-V semiconductor light emitting device of claim 1, wherein the first conductive clad layer is an AlGaInP-based semiconductor mixed-crystal.

20. The III-V semiconductor light emitting device of claim 1, wherein all the Al compositions X1, X2, and X3 are greater than 0.

21. The method for manufacturing the III-V light emitting device of claim 10, wherein all the Al compositions X1, X2, and X3 are greater than 0.

22. A III-V semiconductor light emitting device comprising a first conductive clad layer, an active layer, and a second conductive clad layer laminated on a substrate in this order closer to the substrate, wherein
the second conductive clad layer has a laminated structure of at least three layers, including a first layer, a second layer, and a third layer disposed in this order closer to the active layer,
the second layer and the third layer are included in a striped ridge, and the second layer is positioned at a skirt of the ridge,
the first layer has a flat surface under both sides of the striped ridge and parallel to the active layer,
Al compositions X1, X2, and X3 of the first layer, the second layer, and the third layer, respectively, satisfy a relation:
X2>X1 and X2>X3,
all the Al compositions X1, X2, and X3 are greater than 0, and
film thicknesses D1, D2, and D3 of the first layer, the second layer, and the third layer, respectively, satisfy a relation:
D2<D3.

23. A method for manufacturing a III-V semiconductor light emitting device, the method comprising:
forming on a substrate a first conductive clad layer, an active layer, and a second conductive clad layer, the second conductive clad layer has a laminated structure of at least three layers including a first layer, a second layer, and a third layer disposed in an order closer to the active layer;
processing the third layer to an upper part of the second layer into a stripe shape by non-selective etching; and
processing a lower part of the second layer into a stripe shape by selective etching,
wherein
Al compositions X1, X2, and X3 of the first layer, the second layer, and the third layer, respectively, satisfy a relation:
X2>X1 and X2>X3,
all the Al compositions X1, X2, and X3 are greater than 0, and
film thicknesses D1, D2, and D3 of the first layer, the second layer, and the third layer, respectively, satisfy a relation:
D2<D3.

* * * * *